United States Patent
Hardy et al.

(10) Patent No.: US 11,307,278 B2
(45) Date of Patent: Apr. 19, 2022

(54) RECONSTRUCTION OF MR IMAGE DATA

(71) Applicant: General Electric Company, Schenectady, NY (US)

(72) Inventors: Christopher Judson Hardy, Schenectady, NY (US); Sangtae Ahn, Guilderland, NY (US)

(73) Assignee: General Electric Company, Schenectady, NY (US)

( * ) Notice: Subject to any disclaimer, the term of this patent is extended or adjusted under 35 U.S.C. 154(b) by 372 days.

(21) Appl. No.: 16/733,037

(22) Filed: Jan. 2, 2020

(65) Prior Publication Data

US 2021/0208227 A1    Jul. 8, 2021

(51) Int. Cl.
*G01R 33/56* (2006.01)
*G06T 5/50* (2006.01)
*G06T 11/00* (2006.01)
*G06N 20/00* (2019.01)

(52) U.S. Cl.
CPC ......... *G01R 33/5608* (2013.01); *G06N 20/00* (2019.01); *G06T 5/50* (2013.01); *G06T 11/006* (2013.01); *G06T 11/008* (2013.01); *G06T 2207/10088* (2013.01); *G06T 2207/20081* (2013.01); *G06T 2207/20084* (2013.01); *G06T 2207/20224* (2013.01)

(58) Field of Classification Search
CPC ...... G01R 33/5608; G06N 20/00; G06T 5/50; G06T 11/006; G06T 11/008
See application file for complete search history.

(56) References Cited

U.S. PATENT DOCUMENTS

| | | | | |
|---|---|---|---|---|
| 4,891,595 A | * | 1/1990 | Granot | G01R 33/482 324/309 |
| 5,189,369 A | * | 2/1993 | Takane | G01R 33/563 324/306 |
| 5,432,448 A | * | 7/1995 | Heid | G01R 33/5615 324/309 |
| 6,570,381 B1 | * | 5/2003 | Speier | G01V 3/32 324/303 |
| 7,254,209 B2 | | 8/2007 | Zhao et al. | |

(Continued)

OTHER PUBLICATIONS

Yang, Yang, et al.; "Aliasing Artefact Suppression in Compressed Sensing MRI for Random Phase-Encode Undersampling", IEEE Transactions on Biomedical Engineering, vol. 62, Issue No. 09, pp. 2215-2223, Apr. 2, 2015.

(Continued)

*Primary Examiner* — Dixomara Vargas (57) ABSTRACT

The subject matter discussed herein relates to a fast magnetic resonance imaging (MRI) method to suppress fine-line artifact in Fast-Spin-Echo (FSE) images reconstructed with a deep-learning network. The network is trained using fully sampled NEX=2 (Number of Excitations equals to 2) data. In each case, the two excitations are combined to generate fully sampled ground-truth images with no fine-line artifact, which are used for comparison with the network generated image in the loss function. However, only one of the excitations is retrospectively undersampled and inputted into the network during training. In this way, the network learns to remove both undersampling and fine-line artifacts. At inferencing, only NEX=1 undersampled data are acquired and reconstructed.

20 Claims, 8 Drawing Sheets

(56) References Cited

U.S. PATENT DOCUMENTS

| | | | |
|---|---|---|---|
| 8,233,586 B1 | 7/2012 | Boas | |
| 8,509,514 B2 | 8/2013 | Chen | |
| 9,846,214 B2 | 12/2017 | Zhou et al. | |
| 10,175,317 B2 * | 1/2019 | Wheaton | G01R 33/4822 |
| 10,591,561 B2 * | 3/2020 | Sacolick | G01R 33/5659 |
| 11,033,199 B2 * | 6/2021 | Johnson | A61B 5/055 |
| 2009/0085563 A1 * | 4/2009 | Bito | G01R 33/561 |
| | | | 324/307 |
| 2011/0001476 A1 * | 1/2011 | Morrell | G01R 33/246 |
| | | | 324/309 |
| 2016/0282437 A1 * | 9/2016 | Park | G01R 33/5614 |
| 2017/0146631 A1 * | 5/2017 | Beck | G01R 33/5608 |
| 2019/0059780 A1 | 2/2019 | Lee et al. | |
| 2019/0108904 A1 | 4/2019 | Zhou et al. | |
| 2019/0172230 A1 | 6/2019 | Mailhe et al. | |

OTHER PUBLICATIONS

Lee, Dongwook, et al.; "Deep Residual Learning for Accelerated MRI Using Magnitude and Phase Networks", IEEE Transactions on Biomedical Engineering, vol. 65, Issue No. 9, pp. 1985-1995, Apr. 2, 2018.

* cited by examiner

RECONSTRUCTION OF MR IMAGE DATA

BACKGROUND

The subject matter disclosed herein relates generally to suppressing the fine-line artifact in fast-spin-echo magnetic resonance images. More specifically, it is related to a fast imaging method to generate NEX=1 (Number of Excitations equals to 1) fast-spin-echo images with no fine-line artifact.

Magnetic resonance imaging (MRI) is a noninvasive medical imaging technique that uses the interaction between radio frequency (RF) pulses, a strong magnetic field and body tissues to obtain images of slices/planes from inside a body. MRI is particularly sensitive in assessing anatomical structures, organs and soft tissues for the detection and diagnosis of a broad range of pathological conditions. In some cases MRI may provide better images of organs and soft tissue than other scanning techniques, such as computed tomography (CT) or x-ray. MRI is especially useful for imaging the brain, the spine, the soft tissue of joints, and the inside of bones. In clinical practice, MM provides contrast between benign and pathological tissues and may be used to assess the stage of diseases (such as cancers) as well as to evaluate the response to treatment of malignancies.

With the increasing demands for higher resolution MR images, the reduction of MRI acquisition time is an ongoing challenge. Various technologies have been developed to improve MR imaging speed/efficiency, including parallel imaging (PI) and compressed sensing (CS). Nevertheless, these methods have their limitations. For example, the use of PI may reduce the signal-to-noise ratio due to the decrease in the number of k-space (Fourier space) lines; and CS relies on enforcing sparsity in some domain (e.g. total-variation or wavelet), and can result in smoothing or blurring of the image. Recent advances in deep machine learning using neural networks have shown potential in MR imaging reconstruction. The deep-learning MRI reconstruction networks, including unrolled iterative compressed sensing networks, have been shown to outperform conventional Parallel Imaging and Compressed Sensing (PICS) methods for reconstructing high-quality images from undersampled data (e.g., undersampled NEX=1 data). When applied to fast-spin-echo (FSE) data, however, these networks may yield images exhibiting fine-line artifact.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a method for training a deep-learning network is provided. In accordance with this method, fully sampled NEX=2 (Number of Excitations equals to 2) data are acquired using two excitations. Fully sampled ground-truth images are generated using the acquired NEX=2 data. Undersampled NEX=1 data are generated from one of the excitations. The deep-learning network is trained by feeding the undersampled NEX=1 data and comparing the network output images with the fully sampled ground-truth images in a loss function.

In a further embodiment, a method for using a trained deep-learning network to suppress the fine-line artifact is provided. In accordance with this method, at the training stage, fully sampled NEX=2 data are acquired using two excitations. Fully sampled ground-truth images are generated using the acquired NEX=2 data. Undersampled NEX=1 training data are generated from one of the excitations. The deep-learning network is trained by feeding the undersampled NEX=1 training data and comparing the network output images with the fully sampled ground-truth images generated from the NEX=2 data in a loss function. At the next application stage, undersampled NEX=1 data are acquired to be used as input to feed into the trained deep-learning network to reconstruct NEX=1 images with suppressed undersampling and fine-line artifacts.

In an additional embodiment, a magnetic resonance imaging system is provided. The magnetic resonance imaging system includes a data acquisition component for acquiring undersampled MR data. The magnetic resonance imaging system also include a data processing component and a data storage component. The data storage component may perform the following operations: storing undersampled MR data acquired by the data acquisition component; storing executable code for operation of the magnetic resonance imaging system, whereby the executable code, when executed by the data processing component, causes the data processing component to provide the undersampled MR data to a deep-learning network as input data and to receive reconstructed MR images from the deep-learning network as output data; and storing reconstructed MR images. The magnetic resonance imaging system further includes a data display component for displaying the reconstructed MR images for review.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

Magnetic resonance imaging (MRI) is a non-invasive medical imaging technique that is widely used in the clinical diagnosis and pathological analysis. In principle, MRI techniques use the interaction between radio frequency (RF) pulses, a strong magnetic field and body tissues to generate images of the organs from inside a body. In most medical applications, hydrogen nuclei (which consist solely of a proton) that are in tissues create a signal that is processed to form images of the body. Only a small part of the hydrogen nuclei contributes to the measured signal due to their different alignment in the magnetic field. The protons are capable of absorbing energy when exposed to a short RF pulse (electromagnetic energy) at their resonance frequency. After absorbing energy from the RF pulse, the nuclei are promoted to the excited state where they only stay for a short time period, and then return to their initial state of equilibrium (so-called decay) by releasing energy. This transmission of energy by the nuclei as they return to their initial state is what is observed as the MRI signal. The subtle differences of that signal from different tissues combined with advanced signal processing algorithms implemented on modern computing devices is what enables MM to distinguish between various organs. Any imaging plane, or slice, can be projected, and then stored or printed for further diagnosis and treatment.

MRI scanners use strong magnetic fields, magnetic field gradients, and RF pulse sequence to generate images of the organs in the body. The MR signal is an electrical current induced in the receiver coil by the precession of the net magnetization (M) of certain type nuclei (e.g., hydrogen nuclei) existing in the tissues during resonance. Spin echo acquisition is one of the most common techniques used in MR imaging. It involves using a set of RF pulses to excite the magnetization and then refocus the spins to generate signal echoes (called spin-echoes). For example, it may use a 90-degree RF pulse to excite the magnetization, followed by a 180-degree pulse to refocus the nuclei spins to generate the spin-echo signal. However, using conventional-spin-echo (CSE) may take a considerable amount of time to complete a fully sampled MRI scan. This is primarily due to the fact that only one signal echo is measured during each repetition time (TR, defined as the time from the application of an excitation pulse to the application of the next pulse). Fast-spin-echo (FSE) is an adaptation of CSE acquisition techniques aimed at reducing imaging time. It is more efficient because multiple signal echoes are recorded after each excitation pulse (i.e., multiple echoes per TR). Therefore, FSE has largely supplanted the original spin-echo technique due to vastly improved imaging speed.

Deep-learning MRI reconstruction networks, including unrolled iterative compressed-sensing networks, have been shown to outperform conventional PICS (Parallel Imaging and Compressed Sensing) methods for reconstructing high-quality images from undersampled data. However, when applied to FSE data these networks may yield images exhibiting fine-line artifact. Such artifact may be confused with a pathology or may reduce the quality of medical examinations. Fine-line artifact has been dealt with previously by several different approaches, yet these all have drawbacks or limitations. In some embodiments, acquiring even number of excitations (NEX) (e.g., 2, 4, or higher) data with RF phase cycling may cancel the fine-line artifact, but this at least doubles the imaging time. In other embodiments, the fine-line artifact may be reduced by filtering out or trimming the edges of the echoes, which, however, degrades image resolution. In some cases, increasing crusher areas may be helpful for attenuating the fine-line artifact, but this increases echo spacing and causes image blurring.

The subject matter discussed herein relates to a method that suppresses fine-line artifact in FSE images reconstructed with a deep-learning network. The network is trained using examples of fully sampled NEX=2 data. In each case, two excitations are combined to generate fully sampled ground-truth images with no fine-line artifact, which are used for comparison with the generated image in a loss function. However only one of the excitations is retrospectively undersampled and fed into the input of the network during training. In this way, the network learns to remove both undersampling and fine-line artifacts. At inferencing, only NEX=1 undersampled data are acquired and reconstructed.

With the preceding in mind, material related to imaging techniques and terms is provided below to impart some familiarity with such imaging systems and to provide useful real-world context for other aspects of the disclosure. With respect to magnetic resonance imaging (MM) systems, and turning to FIG. 1 where one such system is schematically illustrated for reference, interactions between a primary magnetic field, time varying magnetic gradient fields, and a radiofrequency (RF) field with material(s) having a non-zero nuclear magnetic moment within a subject of interest (e.g., a patient) are used to generate images or volumetric representations of structural and/or functional relationships within the patient. Nuclei that have a non-zero nuclear magnetic moment, such as hydrogen nuclei in water molecules, have characteristic behaviors in response to externally applied electromagnetic fields (e.g., constant or time varying electric fields, magnetic fields, or a combination thereof) that may be leveraged in this manner. For example, the precession of spins of these nuclei can be influenced by manipulation of the fields to produce RF signals that can be detected, processed, and used to reconstruct a useful image.

Figure 1:
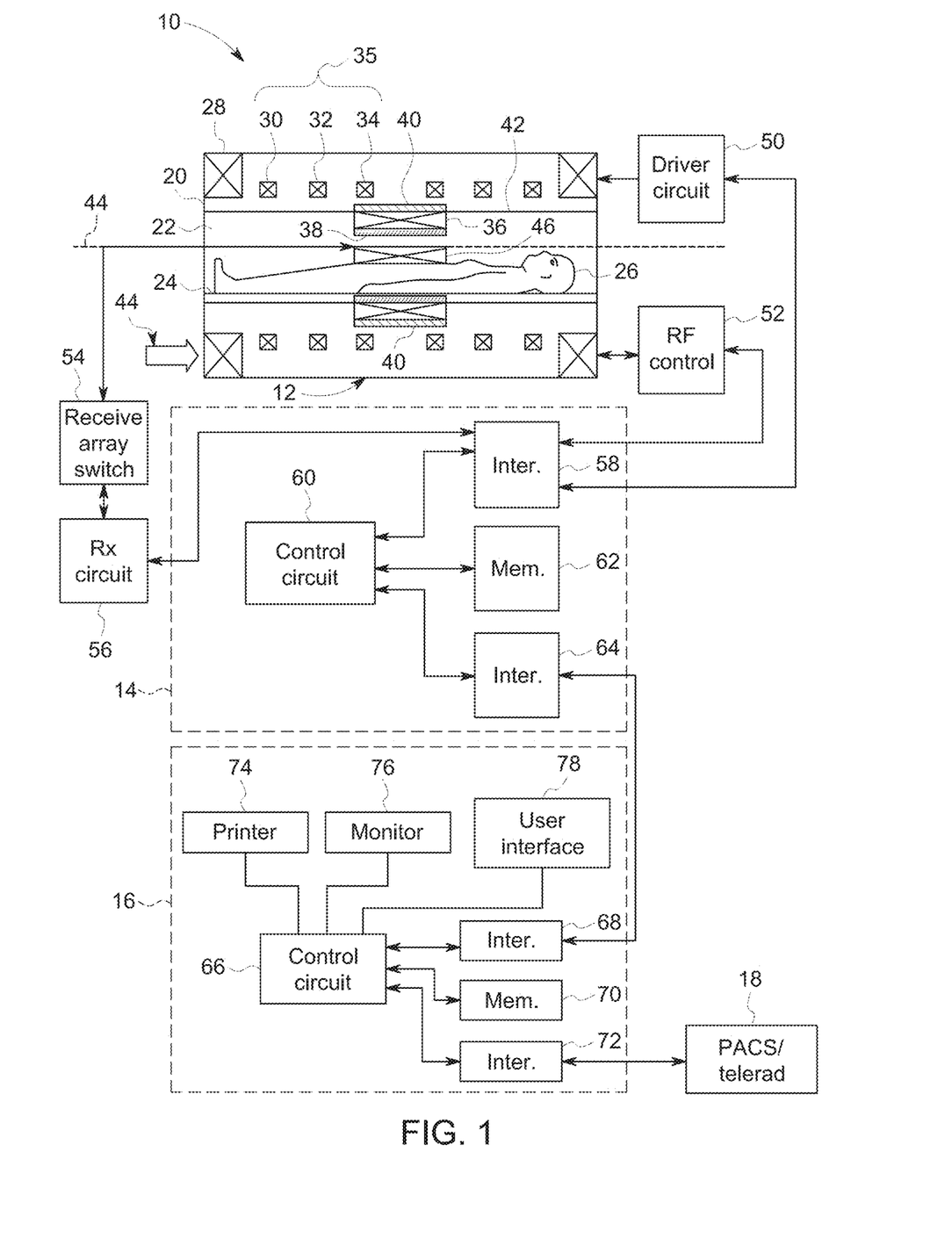
FIG. 1 illustrates a magnetic resonance imaging (MM) system, in accordance with aspects of the present disclosure.

With this in mind, and referring to FIG. 1, a magnetic resonance imaging system 10 is illustrated schematically as including a scanner 12, scanner control circuitry 14, and system control circuitry 16. The imaging system 10 additionally includes remote access and storage systems 18 and/or devices such as picture archiving and communication systems (PACS), or other devices such as teleradiology equipment so that data acquired by the imaging system 10 may be accessed on- or off-site. While the imaging system 10 may include any suitable scanner or detector, in the illustrated embodiment, the imaging system 10 includes a full body scanner 12 having a housing 20 through which an opening (e.g., an annular opening) is formed to accommodate a patient bore 22. The patient bore 22 may be made of any suitable material such as a non-metallic and/or non-magnetic material and generally includes components of the scanner 12 proximate to a subject. A table 24 is moveable into the patient bore 22 to permit a patient 26 to be positioned therein for imaging selected anatomy within the patient 26. As described herein, the patient bore 22 may include one or more bore tubes to support various components of the scanner 12 and/or the patient 26. In some embodiments, the patient bore 22 may support the table 24 and/or articulation components (e.g., a motor, pulley, and/or slides).

The scanner 12 may include a series of associated superconducting magnet coils for producing controlled static magnetic fields for separating the allowed energy states of nuclei with non-zero magnetic moment, typically hydrogen in the body, within the anatomy of the subject being imaged. Specifically, a primary magnet coil 28 is provided for generating a primary magnetic field, which is generally aligned with an axis 44 of the patient bore 22. A series of gradient coils 30, 32, and 34 (collectively 35) permit controlled magnetic gradient fields to be generated for positional encoding of certain of the nuclei within the patient 26 during examination sequences. An RF coil 36 is configured to generate radio frequency pulses for exciting the certain nuclei with non-zero magnetic moment within the patient 26. In accordance with an aspect of the present disclosure, the RF coil 36 may be implemented on a coil support tube 38 defining at least a portion of the patient bore 22. Further, an RF shield 40 may be implemented on a shield support tube 42 also defining at least a portion of the patient bore 22 to reduce electromagnetic interference within the imaging system 10, as well as devices separate from the imaging system 10. In addition to the coils that may be local to the scanner 12, the imaging system 10 may also include a set of receiving coils 46 (e.g., an array of coils) configured for placement proximal (e.g., against) to the patient 26. As an example, the receiving coils 46 can include cervical/thoracic/lumbar (CTL) coils, head coils, single-sided spine coils, and so forth. Generally, the receiving coils 46 are placed close to or on top of the patient 26 so as to receive the weak RF signals (e.g., weak relative to the transmitted pulses generated by the scanner coils) that are generated by certain of the nuclei with non-zero magnetic moment within the patient 26 as they return to their equilibrium state. In some embodiments, the RF coils 36 may both transmit and receive RF signals accomplishing the role of the receiving coils 46.

The various coils of the imaging system 10 are controlled by external circuitry to generate the desired field and pulses, and to read emissions from precessing nuclei with non-zero nuclear magnetic moment (material) in a controlled manner. In the illustrated embodiment, a main power supply 48 provides power to the primary magnetic coil 28 to generate the primary magnetic field. A driver circuit 50 may include amplification and control circuitry for supplying current to the coils as defined by digitized pulse sequences output by the scanner control circuitry 14.

An RF control circuit 52 is provided for regulating operation of the RF coil 36. The RF control circuit 52 includes a switching device for alternating between the active and inactive modes of operation, wherein the RF coil 36 transmits and does not transmit signals, respectively. The RF control circuit 52 may also include amplification circuitry to generate the RF pulses. Similarly, the receiving coils 46, or RF coil 36 if no separate receiving coils 46 are implemented, are connected to a switch 54, which is capable of switching the receiving coils 46 between receiving and non-receiving modes. Thus, the receiving coils 46 may resonate with the RF signals produced by the transverse magnetization of nuclei with non-zero nuclear magnetic moment from within the patient 26 while in the receiving mode, and avoid resonating with RF signals while in the non-receiving mode. Additionally, a receiving circuit 56 may receive the data detected by the receiving coils 46 and may include one or more multiplexing and/or amplification circuits.

It should be noted that while the scanner 12 and the control/amplification circuitry described above are illustrated as being connected by single lines, one or more cables or connectors may be used depending on implementation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner 12 and the scanner control circuitry 14 and/or system control circuitry 16.

As illustrated, the scanner control circuitry 14 includes an interface circuit 58, which outputs signals for driving the gradient coils 35 and the RF coil 36 and for receiving the data representative of the magnetic resonance signals produced in examination sequences. The interface circuit 58 may be connected to a control and analysis circuit 60. The control and analysis circuit 60 executes the commands to the driver circuit 50 and RF control circuit 52 based on defined protocols selected via system control circuitry 16.

The control and analysis circuit 60 may also serve to receive the magnetic resonance signals and perform subsequent processing before transmitting the data to system control circuitry 16. Scanner control circuitry 14 may also include one or more memory circuits 62, which store configuration parameters, pulse sequence descriptions, examination results, and so forth, during operation.

A second interface circuit 64 may connect the control and analysis circuit 60 to a system control circuit 66 for exchanging data between scanner control circuitry 14 and system control circuitry 16. The system control circuitry 16 may include a third interface circuit 68, which receives data from the scanner control circuitry 14 and transmits data and commands back to the scanner control circuitry 14. As with the control and analysis circuit 60, the system control circuit 66 may include a central processing unit (CPU) in a multi-purpose or application specific computer or workstation. System control circuit 66 may include or be connected to a second memory circuit 70 to store programming code for operation of the imaging system 10 and to store the processed image data for later reconstruction, display and transmission. The programming code may execute one or more routines that, when executed by a processor, are configured to perform reconstruction of acquired data or other operations involving the acquired data.

An additional input output (I/O) interface 72 may be provided for exchanging image data, configuration parameters, and so forth with external system components such as remote access and storage systems 18. Finally, the system control circuit 66 may be communicatively coupled to various peripheral devices for facilitating an operator interface and for producing hard copies of the reconstructed images. In the illustrated embodiment, these peripherals include a printer 74, a monitor 76, and a user interface 78 including, for example, devices such as a keyboard, a mouse, a touchscreen (e.g., integrated with the monitor 76), and so forth.

In operation, a user (e.g., a radiologist) may configure and/or oversee control of the imaging system 10. Additionally, the user may assist in positioning the subject (e.g., a patient 26) within the patient bore 22. In some embodiments, the patient bore 22 may surround an entire subject or just a portion thereof (e.g., a patient's head, thorax, and/or extremity) while an imaging session is performed.

As described in preceding sections, an MRI system (such as the imaging system 10 described above) uses a set of RF pulses applied to a sample to produce a specific form of magnetic resonance signal. The set of RF pulses, together with associated gradient pulses and receiver acquisition timing, is called a pulse sequence. It should be noted that a single RF pulse only generates a Free-Induction Decay (FID), while two successive RF pulses may produce a Spin-Echo (SE) signal. More specifically, the FID is elicited by a single RF pulse (excitation pulse), but the decayed signal can be recovered (or refocused) by applying one or more additional RF pulses (refocusing pulses). For example, a spin echo acquisition may use a 90-degree RF pulse to excite the magnetization and one or more 180-degree pulses to refocus the spins to generate SE signals, in the form of electrical current induced in the receiving coil (e.g., the receiving coils 46 in the scanner 12, as shown in FIG. 1) by the precession of the net magnetization during magnetic resonance.

Figure 2A:
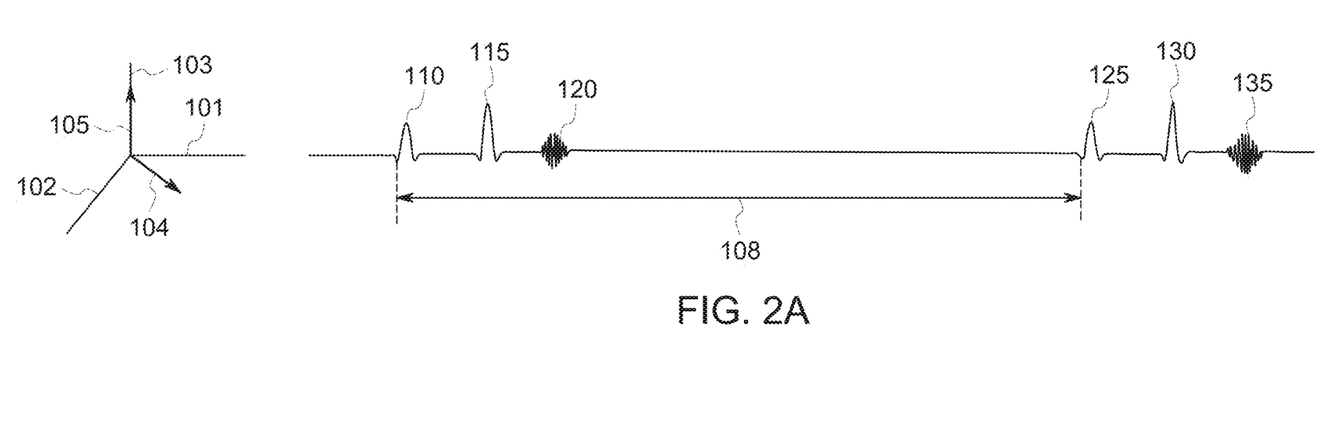
FIGS. 2A and 2B illustrate portions of the pulse sequence in conventional-spin-echo (CSE) and in fast-spin-echo (FSE) respectively, in accordance with aspects of the present disclosure.
Figure 2B:
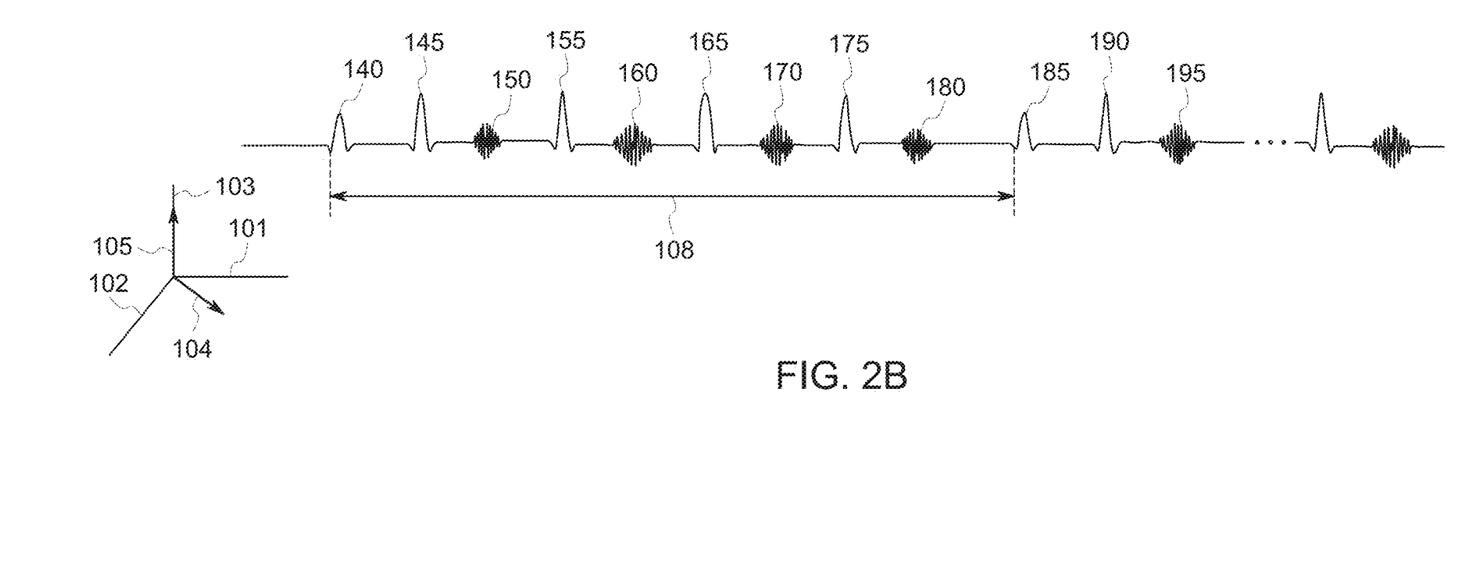

With this in mind, and to provide further familiarity with principles of magnetic resonance imaging, FIGS. 2A and 2B illustrate a portion of a pulse sequence in Conventional Spin-Echo (CSE) and in Fast-Spin-Echo (FSE) respectively. In a CSE acquisition (FIG. 2A), applying a 90-degree excitation pulse 110 rotates a longitudinal magnetization 105 (along a vertical axis 103) into a horizontal plane in the rotating frame (i.e., the plane containing both axis 101 and axis 102, which are perpendicular to each other, and also to the axis 103, in a reference frame rotating at the Larmor frequency about the z-axis), and a dephasing of the transverse magnetization 104 starts shortly afterward. A following application of a 180-degree refocusing pulse 115 generates a spin echo signal 120 by rotating the dephased magnetization in the horizontal plane. The purpose of the refocusing pulse is to re-phase the spins, causing them to regain coherence and thereby to recover the transverse magnetization 104, producing the spin-echo signal 120. Repeating such a process by applying a series of excitation and refocusing pulses will produce a series of echo signals, which, in conjunction with the relevant gradient pulses, may be detected, processed, and used to reconstruct a useful image. For example, as shown in FIG. 2A, a second 90-degree excitation pulse 125 and a successive second 180-degree refocusing pulse 130 will result in a second spin echo signal 135.

A repetition time 108 is defined as the time from the application of an excitation pulse (e.g., the 90-degree excitation pulse 110) to the application of the next excitation pulse (e.g., the 90-degree excitation pulse 125). It should be noted that although the examples above show the generation of spin echoes by successive 90-degree and 180-degree pulses, these precise flip angles are not necessarily required. For example, spin echoes can be formed by two successive 90-degree RF pulses.

As a comparison to the CSE acquisition case (FIG. 2A), where only one echo (e.g., the spin echo signal 120) is measured during each repetition time (TR), the FSE acquisition (FIG. 2B) is more efficient because multiple spin echoes can be recorded after each 90-degree excitation pulse (e.g., echo signals 150, 160, 170, and 180 after a first 90-degree excitation pulse 140, and echo signals 195 and following echo signals that may not be shown here after a second 90-degree excitation pulse 185). This is achieved by transmitting a series of 180-degree refocusing pulses within each TR (e.g., refocusing pulses 145, 155, 165, and 175 after the first 90-degree excitation pulse 140 in the first repetition time 108, and refocusing pulses 190 and following refocusing pulses that may not be shown here after the second 90-degree excitation pulse 185 in the following TR), and measuring the corresponding echoes according to a slightly different phase-encoding gradient. As a result, FSE acquisition may be preferred to the CSE technique due to improved imaging speed.

Figure 3:
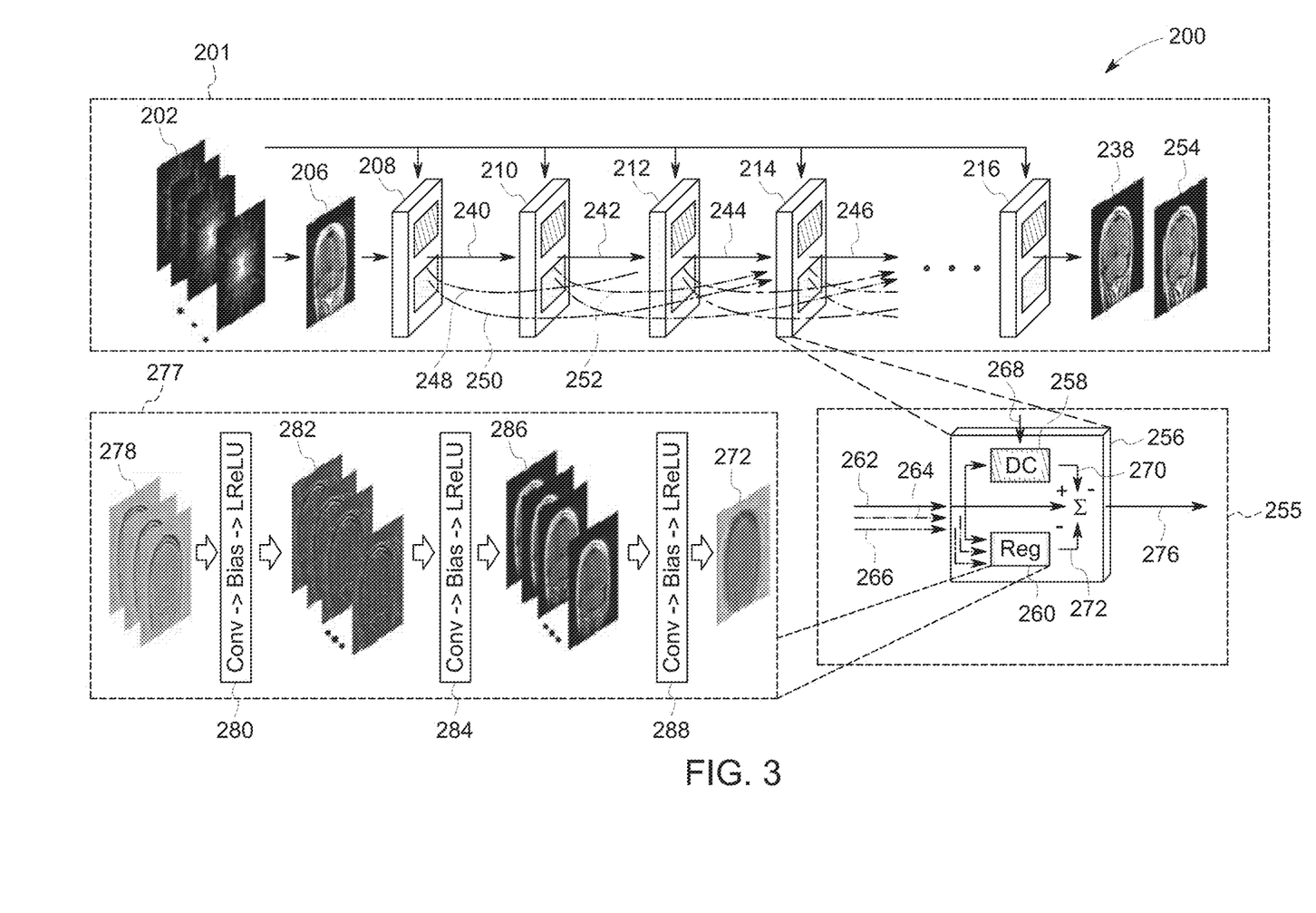
FIG. 3 illustrates schematic diagram of an embodiment of a Densely Connected Iterative (DCI) deep-learning network used for image reconstruction from undersampled data, in accordance with aspects of the present disclosure.

With the preceding comments in mind, in certain embodiments, and as illustrated in FIG. 3, an unrolled iterative compressed-sensing Densely Connected Iterative (DCI) deep-learning network 200 that may be used for reconstructing high-quality images from undersampled data may be provided. The DCI deep-learning network 200 may be similar to the network described in U.S. Pat. No. 10,489,943 B2, entitled "System and Method for Sparse Image Reconstruction", which is incorporated by reference in its entirety for all purposes. The DCI deep-learning network 200 includes a plurality of iterative blocks (as shown by reference number 201). Each of these iterative blocks includes data-consistency (DC) and regularization (Reg) elements (as shown by reference number 255). The Reg elements are convolutional networks in this embodiment (as shown by reference number 277).

The DCI deep-learning network 200 receives undersampled magnetic resonance coil data 202, which has been retrospectively down-sampled from a set of fully sampled magnetic resonance coil data to train the network. In the illustrated embodiment, the undersampled magnetic resonance coil data 202 are down-sampled from two-dimensional k-space datasets from a plurality of coils (e.g., the receiving coils 46 depicted in FIG. 1). The undersampled magnetic resonance coil data 202 are used to create initial input image 206. The DCI deep-learning network 200 further includes a plurality of iterative blocks, such as iterative blocks 208, 210, 212, 214, and 216. The first iterative block 208 is configured to generate a first iterative block output based on initial input image 206 and the undersampled coil data 202. The first iterative block output is provided to the second iterative block 210 as a direct input by a direct connection 240. Further, the first iterative block output is also provided as (in this embodiment, two) skip inputs to subsequent iterative blocks 212 and 214 through dense skip connections 248 and 250 respectively. Similarly, the second iterative block 210 is configured to generate a second iterative block output based on the first iterative block output and the undersampled coil data 202. The third iterative block 212 is configured to receive the second iterative block output through a direct connection 242 and the first iterative block output through a dense skip connection 248. The third iterative block 212 is also configured to receive the coil data 202 and generate a third iterative block output. Similar iterations are performed by the succeeding iterative blocks (including the fourth iterative block 214, the last iterative block 216, and a plurality of iterative blocks, though not shown in FIG. 3, between blocks 214 and 216). In the end of the iteration process, the last iterative block 216 is configured to generate an estimated (or predicted) image 238 based on an iterative block output through a direct connection of its adjacent preceding iterative block (not shown), as well as iterative block outputs from dense skip connections of iterative blocks preceding that adjacent preceding iterative block and the undersampled coil data 202. In addition, the fully sampled magnetic resonance coil data is reconstructed to form a reference image 254 for comparison with the output from DCI deep-learning network 200 (i.e., the estimated image 238).

In the illustrated embodiment, the fourth iterative block 214 is configured to receive three iterative block outputs from preceding iterative blocks, including the third iterative block 212 (through the direct connection 244), the second iterative block 210 (through the dense skip connection 252), and the first iterative block 208 (through the dense skip connection 250). The reconstruction process in each iterative block (such as the block 214) may be further illustrated using a block diagram of an iterative block 256 as shown in inset 255. As stated previously, each of the plurality of iterative blocks 208, 210, 212, 214, and 216 incudes a data consistency (DC) unit and a regularization (Reg) unit. Similarly, the iterative block 256 includes a DC unit 258 and a Reg unit 260. The DC unit 258 is configured to preserve fidelity of coil data in the iterative block output. The Reg unit 260 is configured to generate regularization information based on a plurality of skip inputs. The regularization information is representative of additional information required to reduce generalization error in output of the iterative block.

The iterative block 256 provides a solution to image reconstruction formulated as an optimization problem. The DC unit 258 is configured to receive a first input 262, which is an iterative block output from an adjacent preceding iterative block. The DC unit 258 is also configured to receive a coil data 268 (equivalent of the undersampled coil data 202). Further, the DC unit 258 is configured to generate an output 270 representative of a correction required to maintain data consistency in the first input 262. The Reg unit 260 is configured to receive the first input 262 and a plurality of iterative block outputs 264 and 266 as skip inputs from iterative blocks preceding that adjacent preceding iterative block. The Reg unit 260 is configured to generate regularization information 272 representative of additional information required to determine a valid solution to an ill-posed optimization problem. The Reg unit 260 is able to propagate features across multiple iterative blocks to generate regularization information 272. The iterative block 256 is configured to generate an output 276 based on the first input 262, the output 270 from the DC unit 258, and the output regularization information 272 from the Reg unit 260.

In one embodiment, the Reg unit 260 is a deep convolutional neural network as illustrated in inset 277. The deep convolutional neural network is configured to receive regularization information 278 from a plurality of preceding iterative blocks and generate a reconstructed image 290. The deep convolutional neural network includes a plurality of stages 280, 284, and 288. Each of the plurality of stages 280, 284, and 288 includes a feature generator (Convolution), a bias provider (Bias) and an activation layer (for example, leaky rectified linear unit (LReLU)). The feature generator is a convolutional layer having a plurality of filters configured to generate a plurality of feature maps based on a plurality of input images. The bias provider is configured to receive the plurality of feature maps and generate a plurality of biased feature maps. The activation layer is configured to receive the plurality of biased feature maps and generate one or more output images. In this illustrated embodiment, the plurality of stages include a first stage 280, a second stage 284, and a third stage 288. The first stage 280 is configured to process the plurality of input images 278 to generate a first plurality of output images 282. The plurality of input images 278 may be an output of one of an immediately preceding iterative block or a skip iterative block (such as the first input 262 and a plurality of iterative block outputs 264 and 266 as skip inputs shown in inset 255). The second stage 284 is configured to process the first plurality of output images 282 and generate a second plurality of output images 286. Similarly, the third stage 288 is configured to process the second plurality of output images 286 to generate the regularization information 272. In one embodiment, about twelve filters are used to generate the first plurality of output images 282 and the second plurality of output images 286. Although only three stages are illustrated in the embodiment shown in inset 277, ten or more stages may be used to process skip inputs in each regularization unit, such as Reg unit 260 in inset 255.

As stated previously, deep learning Mill reconstruction networks, including unrolled iterative compressed-sensing networks may reconstruct high-quality images from undersampled data. However, when applied to FSE data, these networks may yield images exhibiting fine-line artifact. This artifact arises because the refocusing pulses (such as refocusing pulses 145, 155, 165, and 175 shown in FIG. 2B) are typically not perfect 180-degree pulses, resulting in Free-Induction-Decay (FID) signals from the refocusing pulses that bleed into the echoes in the echo train. This problem can be exacerbated at fields of 3T or higher, because the amplitude of the refocusing pulses is often deliberately limited so as to reduce specific absorption rate (SAR). While crusher gradients can help ameliorate this problem, they are often imperfect due to limits on amplitude and slew rate and the need to minimize echo spacing.

Figure 4A:
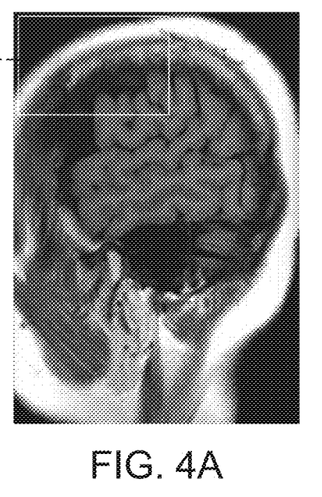
FIGS. 4A, 4B, 4C, and 4D illustrate image examples acquired with NEX=2 and NEX=1 (Number of Excitations equals to 2 and 1, respectively), in accordance with aspects of the present disclosure.
Figure 4B:
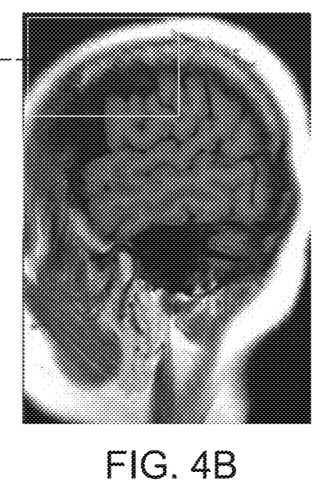
Figure 4C:
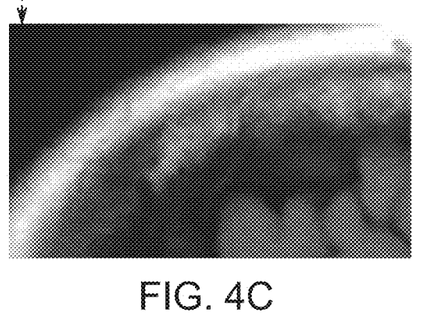
Figure 4D:
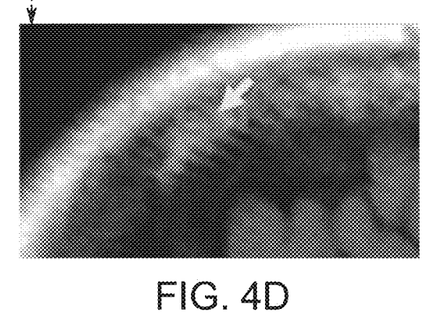

With the preceding in mind, FIGS. 4A, 4B, 4C, and 4D show example images reconstructed from FSE data (MRI images of brain) acquired with NEX=2 (Number of Excitations equals to 2) imaging (FIG. 4A) and NEX=1 imaging (FIG. 4B), with corresponding regions of interest in zoomed-in images FIGS. 4C and 4D respectively. The fine-line artifact is evident in NEX=1 images (e.g., pointed to by an arrow in FIG. 4D) but not in NEX=2 images (e.g., FIG. 4C).

Figure 5A:
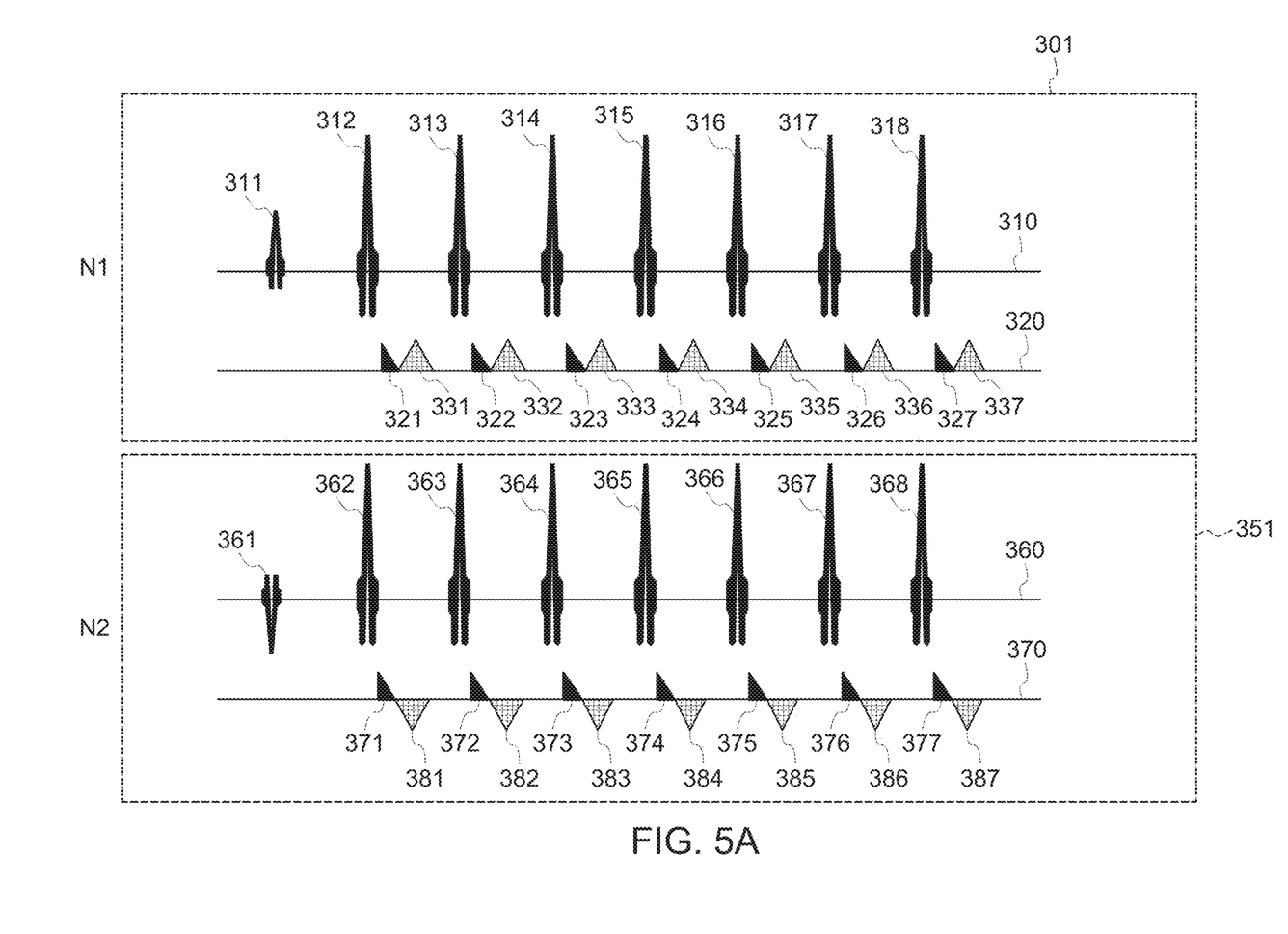
FIGS. 5A and 5B illustrate schematically how a NEX=2 scanning suppresses fine-line artifact, in accordance with aspects of the present disclosure.

The fine-line artifact may be prevented by use of NEX=2 imaging, as shown in FIGS. 4A and 4C. The principle of suppressing the fine-line artifact is further illustrated in FIGS. 5A and 5B. An NEX=2 imaging includes two excitations 301 and 351 (i.e., N1 and N2 as shown in FIG. 5A). Each excitation includes excitation and refocusing pulse sequences and resulting echo trains. For example, the first excitation 301 (N1) includes excitation and refocusing pulse sequences distributed along a time axis 310, and corresponding echo trains distributed along a time axis 320. Similarly, the second excitation 351 (N2) includes excitation and refocusing pulse sequences distributed along a time axis 360, and corresponding echo trains distributed along a time axis 370.

As illustrated in FIG. 5A (the FSE acquisition), each pulse sequence in N1 and N2 may include a 90-degree excitation pulse (such as excitation pulse 311 in N1, and excitation pulse 361 in N2) and a plurality of 180-degree refocusing pulses (such as refocusing pulses 312, 313, 314, 315, 316, 317, and 318 in N1, and refocusing pulses 362, 363, 364, 365, 366, 367, and 368 in N2). If refocusing pulses are not exactly 180 degrees, and gradient crushing is not complete, the resulting echo trains may include artifactual free-induction-decay (FID) signals as well as echo signals, which may lead to fine-line artifact. For example, along the time axis 320 in N1, the FID signals 321, 322, 323, 324, 325, 326, and 327 (black triangles as shown in N1) are adjacent to and partially overlapped with the corresponding echo signals 331, 332, 333, 334, 335, 336, and 337 (meshed triangles as shown in N1).

Figure 5B:
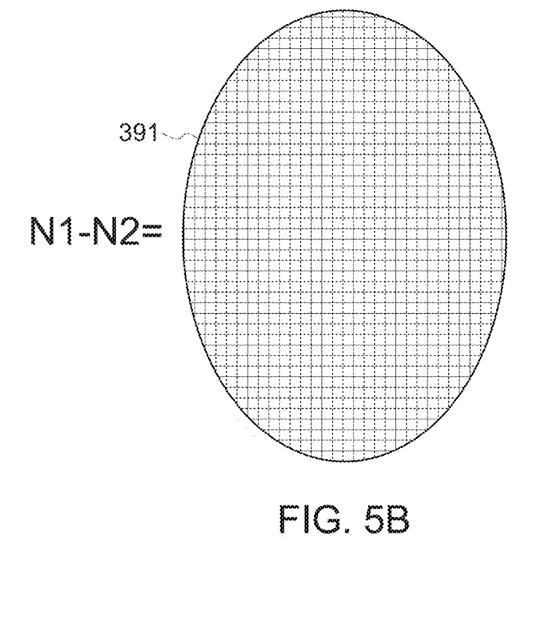

To prevent such fine-line artifact, in the second excitation 351 (N2) of the illustrated embodiment (in FIG. 5A), the phase of excitation pulse 361 is inverted. Inverting the phase of the RF excitation pulse (such as excitation pulse 361) will invert the phases of the resulting echo signals (such as echo signals 381, 382, 383, 384, 385, 386, and 387 in N2) in the echo trains. However, the phases of FID signals (such as 371, 372, 373, 374, 375, 376, and 377 in N2) will not be inverted because the FIDs arise directly from the refocusing pulses (such as 362, 363, 364, 365, 366, 367, and 368 in N2). Therefore, subtraction of echo trains of the second excitation 351 (N2) from the echo trains of the first excitation 301 (N1) will subtract the artifactual FID signals, while effectively adding the echo signals from the two excitations. The subtraction (i.e., N1−N2) result, as illustrated in FIG. 5B, is an image with no fine-line artifact. That is, all the FID signals (black triangles as shown in FIG. 5A) are cancelled by subtraction, yet the desired echo signals (meshed triangles as shown in FIG. 5A) are effectively added. It should be noted that, for simplicity FIG. 5A does not show secondary echoes that are generated by the refocusing of FID signals (such as FID signals 321, 322, 323, 324, 325, 326, and 327 in N1, and FID signals 371, 372, 373, 374, 375, 376, and 377 in N2). These secondary echoes are also suppressed by performing the subtraction N1−N2. Also note that other forms of phase cycling may be employed, such as giving excitation pulses 311 and 361 phases of 90 degrees and 270 degrees, respectively, rather than 0 degrees and 180 degrees, as shown in FIG. 5A.

The drawback of this NEX=2 (Number of Excitations equals to 2) imaging approach is that the imaging time may be doubled. This approach can be problematic if fast imaging is required. While the use of undersampling can partially compensate for this, overall imaging speeds remain suboptimal with NEX=2. Therefore, a method is needed for generating NEX=1 FSE images with no fine-line artifact, with acceleration factor R>1. Here the ratio of full phase-encoding steps to the reduced set is referred to as the acceleration factor R.

Figure 6:
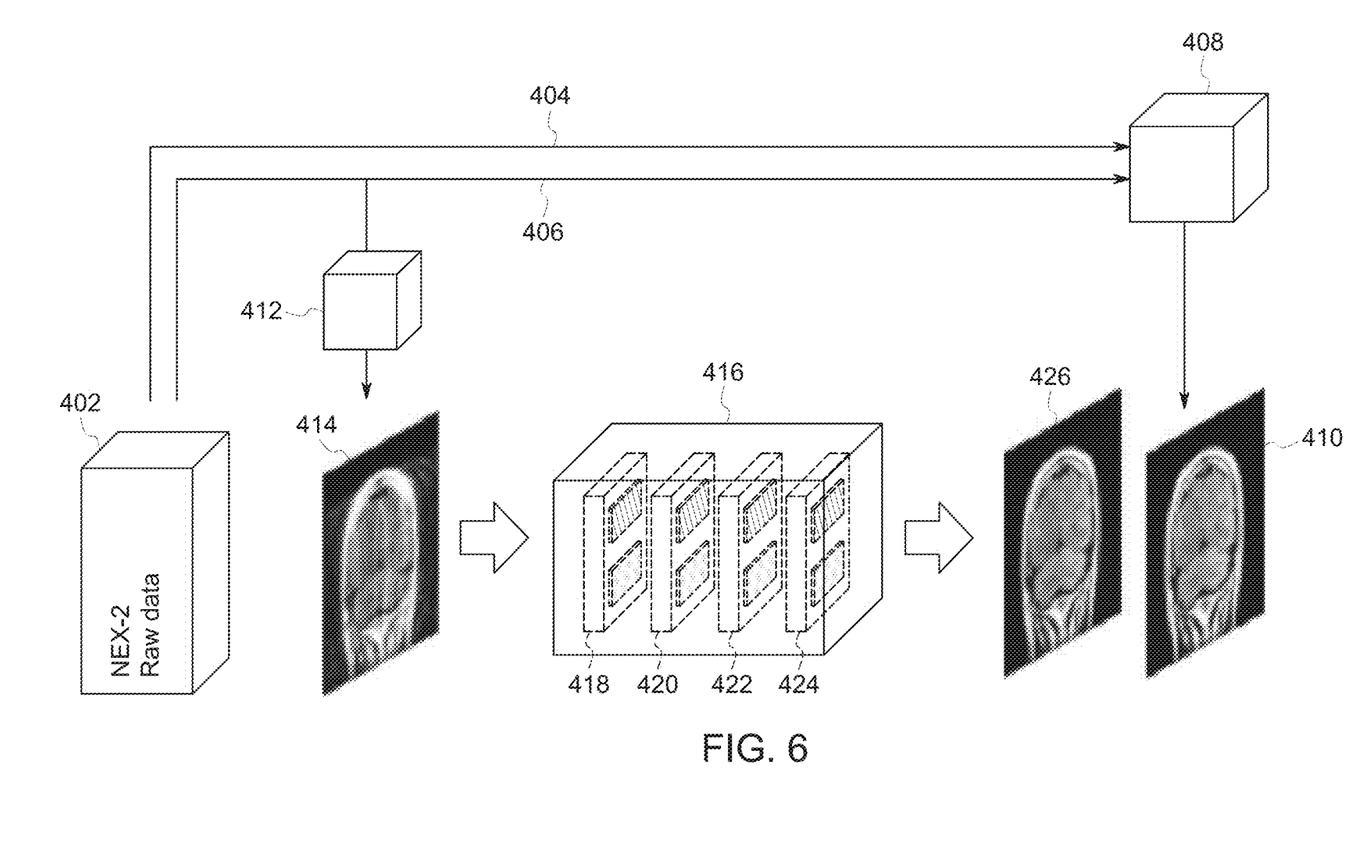
FIG. 6 illustrates a schematic diagram of training a deep learning DCI network to reconstruct undersampled NEX=1 data while removing both undersampling artifacts and fine-line artifact, in accordance with aspects of the present disclosure.

Turning to FIG. 6, a schematic diagram is illustrated of steps for training a deep-learning network (which may be a DCI network) to reconstruct undersampled NEX=1 data while removing both undersampling artifacts and fine-line artifact. Normally, NEX=1 data, which are retrospectively undersampled and zero-filled (for training), are used to feed into deep learning Mill reconstruction networks as an input. And the networks are trained against the corresponding fully sampled images at the output. As explained in preceding sections, such trained networks may not suppress fine-line artifact. In an embodiment shown in FIG. 6, a new technique is demonstrated, wherein a DCI network is instead trained using NEX=2 raw data. Two excitations are combined and reconstructed into a fully-sampled ground truth (GT) image 410 that has no fine-line artifact. However, only one of the two excitations is undersampled and fed into the network as input for training. In this way the network is trained to both remove undersampling artifacts and to suppress fine-line artifact.

In FIG. 6, a DCI deep-learning network 416 may include a plurality of iterative blocks, such as iterative blocks 418, 420, 422, and 424 (similar to the iterative blocks 208, 210, 212, 214 and 216 described in FIG. 3). Each of the plurality of iterative blocks 418, 420, 422, and 424 incudes a data consistency (DC) unit and a regularization (Reg) unit. The DC unit is configured to preserve fidelity of coil data in the iterative block output. The Reg unit is configured to generate regularization information based on an input from the adjacent preceding block and a plurality of skip inputs. The regularization information is representative of additional information required to reduce generalization error in output of the iterative block.

To suppress fine-line artifact, the DCI deep-learning network 416 uses many examples from an NEX=2 raw FSE dataset 402 to train the network, as shown in FIG. 6. Specifically, at training stage, for each NEX=2 raw FSE data the two excitations 404 and 406 are combined and reconstructed (e.g., using a combination and reconstruction module 408) into a fully-sampled ground truth (GT) image 410 that has no fine-line artifact (similar to the N1-N2 example, as illustrated in FIG. 5B), for comparison with the network-generated image 426 in a loss function. However, only one of the two excitations (i.e., excitation 406 in this embodiment) is retrospectively undersampled (e.g., using a sampling module 412) to create NEX=1 undersampled input data 414, which is fed into the DCI deep-learning network 416 during training. In this way the DCI deep-learning network 416 is trained to both remove undersampling artifacts and to suppress fine-line artifact.

Figure 7A:
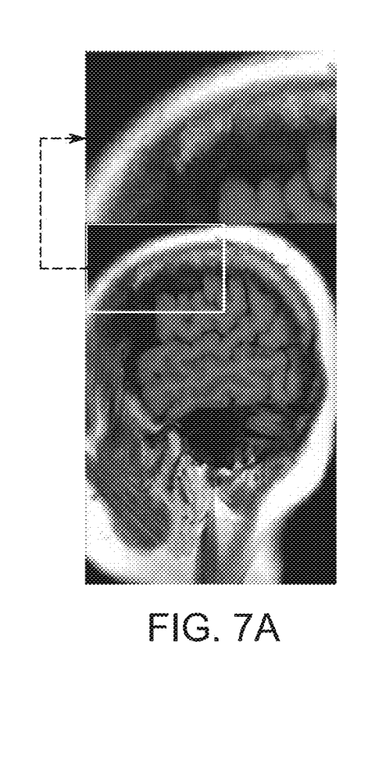
FIGS. 7A, 7B, and 7C illustrate a set of clinical images showing fully sampled NEX=2 image, fully sampled NEX=1 image, and DCI network output image using undersampled NEX=1 data as input.
Figure 7B:
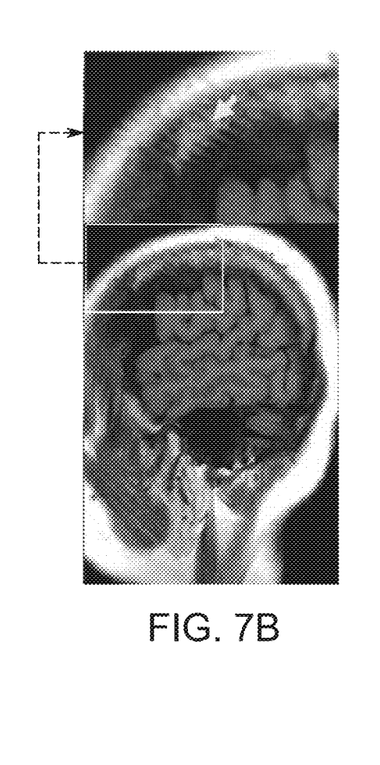
Figure 7C:
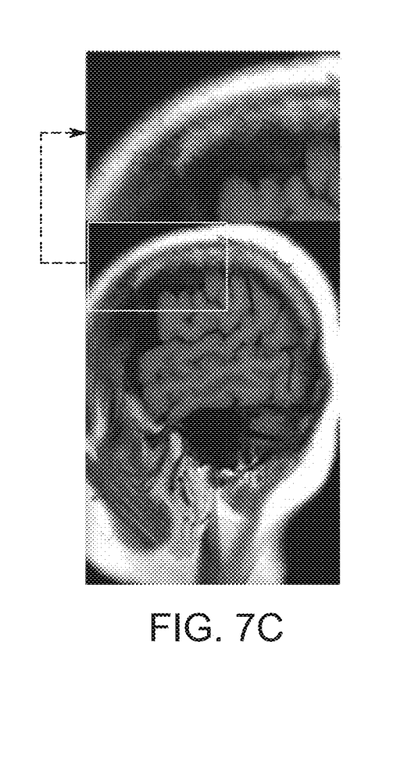

Next, at inferencing stage, only NEX=1 undersampled data are acquired and reconstructed using the trained DCI deep-learning network 416. Therefore, the FSE scanning process can be accelerated, which enables a fast MR imaging method without experiencing fine-line artifact. FIG. 7 demonstrates the effect of the fast FSE scanning with example test results independent from the training data. Each example FSE image (MRI images of brain) is presented with corresponding regions of interest in zoomed-in images at top.

A fully-sampled NEX=1 image (FIG. 7B) reconstructed by conventional means shows fine-line artifact (pointed to by an arrow), unlike the corresponding fully-sampled NEX=2 image (FIG. 7A). The output of the trained DCI deep-learning network (illustrated in FIG. 6), with NEX=1 and the input undersampled fourfold (i.e., factor R=4), is shown in FIG. 7C, where the fine-line artifact has been suppressed. In addition to imaging artifact suppression, imaging speed is accelerated. For example, the imaging time is fourfold lower in FIG. 7C than in FIG. 7B due to the undersampling effect (undersampled by a factor of 4), and eightfold lower than in FIG. 7A due to a combined effect of the undersampling and the speedup of NEX=1 acquisition over NEX=2 acquisition (by a factor of 2).

Technical effects of the disclosed embodiments include providing systems and methods for reconstruction of undersampled fast-spin-echo MR images with suppression of fine-line artifact. The new aspects of the present invention comprise the following: training the deep-learning image reconstruction network with NEX=2 FSE data, which are used to generate fully-sampled ground-truth images with no fine-line artifact for comparison with the generated image in the loss function; while retrospectively undersampling only one excitation from the NEX=2 FSE data and feeding it into the input of the network during training; and acquiring only NEX=1 undersampled data for input into the network during inferencing. The invention in this disclosure may enable FSE scanning (including variants such as T1-FLAIR and T2-FLAIR) at twice the speed, without experiencing fine-line artifact, by allowing the use of NEX=1 acquisition instead of NEX=2 acquisition.

In this disclosure the DCI network is used as an example deep-learning image reconstruction network. However, the technologies may be implemented with other deep-learning networks as well.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for training a deep-learning network, comprising the steps of:
    acquiring magnetic resonance (MR) Spin-Echo (SE) or Fast-Spin-Echo (FSE) datasets, wherein each MR dataset is acquired using at least two excitations including a first excitation and a second excitation, wherein the second excitation uses a phase-inverted excitation radio frequency pulse in comparison to the first excitation;
    generating a respective ground-truth image with no fine-line artifact for each of the MR datasets;
    generating a respective undersampled dataset for each of the MR datasets using one of the two respective excitations; and
    training the deep-learning network by inputting the respective undersampled datasets and comparing output images with the respective ground-truth images.

2. The method of claim 1, wherein the deep-learning network is a densely connected iterative deep-learning network comprising a plurality of iterative blocks.

3. The method of claim 2, wherein each of the plurality of iterative blocks comprises a data consistency unit configured to preserve image fidelity in output of the iterative block, and a regularization unit configured to generate regularization information representing additional information required to reduce generalization error in output of the iterative block.

4. The method of claim 2, wherein each of the plurality of iterative blocks, except the first and second iterative blocks, is configured to generate an estimated image based on an iterative block output through a direct connection of its adjacent preceding iterative block, as well as iterative block outputs from dense skip connections of iterative blocks preceding that adjacent preceding iterative block, and the undersampled dataset.

5. The method of claim 1, wherein the ground-truth images are generated by combining the MR datasets acquired from the two excitations and reconstructing MR images from the combined MR datasets.

6. The method of claim 1, wherein each undersampled dataset is generated by retrospectively down-sampling a respective MR dataset from one of the two excitations.

7. The method of claim 1, wherein the output images are predicted MR images generated by the deep-learning network.

8. The method of claim 1, wherein a loss function is used to evaluate the errors between the output images and the fully sampled ground-truth images.

9. The method of claim 1, wherein the completion of training the deep-learning network is determined by checking minimization of a loss function.

10. A method for using a deep-learning network at inferencing, comprising:
    acquiring undersampled magnetic resonance (MR) data;
    providing the undersampled MR data to the deep-learning network as input data, wherein the deep-learning network receives the undersampled MR data and outputs reconstructed MR images in which undersampling artifacts are suppressed and that do not exhibit substantial fine-line artifacts, wherein the deep-learning network is trained to suppress fine-line artifacts using previously acquired MR data and respective ground-truth images, wherein each of the previously acquired MR data is acquired using a plurality of excitations including at least a first excitation and a second excitation, wherein half of the excitations use a phase-inverted excitation radio frequency pulse in comparison to the other half of the excitations; and
    displaying the reconstructed MR images for review.

11. The method of claim 10, wherein the undersampled MR data are acquired using fast-spin-echo scanning.

12. The method of claim 11, wherein the undersampled MR data are each acquired using only one excitation.

13. The method of claim 10, wherein the number of excitations in the plurality of excitations is an even number that is equal to or greater than 2.

14. The method of claim 10, wherein the previously acquired MR data are fully sampled MR data.

15. The method of claim 10, wherein the previously acquired MR data from the two excitations are combined and reconstructed into the ground-truth images that do not exhibit fine-line artifacts.

16. A magnetic resonance imaging system, comprising:
    a data acquisition component configured to acquire undersampled MR data;
    a data processing component;
    a data storage component configured to:
        store undersampled MR data acquired by the data acquisition component;
        store executable code for operation of the magnetic resonance imaging system, wherein the executable code, when executed by the data processing component, causes the data processing component to provide the undersampled MR data to a deep-learning network as input data and to receive reconstructed MR images from the deep-learning network as output data, wherein the deep-learning network has been trained to use previously acquired MR data and respective ground-truth images to suppress undersampling and fine-line artifacts, wherein each of the previously acquired MR data is acquired using two excitations including a first excitation and a second excitation, wherein the second excitation uses a phase-inverted excitation radio frequency pulse in comparison to the first excitation; and
        store reconstructed MR images; and
    a data display component configured to display the reconstructed MR images for review.

17. The magnetic resonance imaging system of claim 16, wherein the data acquisitions are based on fast-spin-echo acquisition technique.

18. The magnetic resonance imaging system of claim 16, wherein the phase-inverted excitation radio frequency pulse in the second excitation causes the phases of echo signals in a resulting echo train to be inverted but not changing the phases of free-induction decay signals in the same resulting echo train.

19. The magnetic resonance imaging system of claim 18, wherein subtracting a respective echo train resulting from the second excitation from a respective echo train resulting from the first excitation cancels the free-induction decay signals that contribute to the fine-line artifacts while effectively adding the echo signals from the two excitations.

20. The magnetic resonance imaging system of claim 19, wherein the previously acquired MR data used for training the deep-learning network are independent from the undersampled MR data acquired by the data acquisition component.

* * * * *